United States Patent
Preves et al.

(10) Patent No.: US 6,359,992 B1
(45) Date of Patent: *Mar. 19, 2002

(54) ACOUSTICS CONDITIONER

(75) Inventors: David A. Preves; Robert L. Millier, both of Minnetonka; Lawrence T. Hagen, Edina; Ning Shen, Maple Grove, all of MN (US)

(73) Assignee: Micro Ear Technology, Plymouth, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/795,545

(22) Filed: Feb. 6, 1997

(51) Int. Cl.[7] .............................................. H04R 25/00
(52) U.S. Cl. ....................... 381/312; 381/106; 381/123; 381/317
(58) Field of Search .................... 381/68, 68.2, 68.4, 381/312, 320, 321, 106, 107, 104, 317, 56, 57, 94.5, 123, 72, 94.1, 94.7

(56) References Cited

U.S. PATENT DOCUMENTS

| | | | | |
|---|---|---|---|---|
| 3,213,372 A | * | 10/1965 | Kurvits | 381/94.5 |
| 3,928,733 A | * | 12/1975 | Hueber | 381/94.5 |
| 4,405,831 A | * | 9/1983 | Michelson | 381/68 |
| 4,622,692 A | * | 11/1986 | Cole | 381/68.4 |
| 4,630,302 A | * | 12/1986 | Kryter | 381/68.4 |
| 4,750,207 A | * | 6/1988 | Gebert et al. | 381/68.4 |
| 4,759,071 A | * | 7/1988 | Heide | 381/68.4 |
| 5,463,692 A | * | 10/1995 | Fackler | 381/68 |

* cited by examiner

Primary Examiner—Huyen Le
(74) Attorney, Agent, or Firm—Schwegman, Lundberg, Woessner & Kluth, P.A.

(57) ABSTRACT

An acoustic conditioning apparatus. The mechanism includes an attenuator to limit excessive noise levels. The attenuator includes a circuit for compressing an output sound pressure level below a desired level, such as 90 dBA over an eight-hour period. The mechanism also includes an amplifier for conditioning ambient sound level in accordance with the normal needs of a hearing impaired person using the conditioning apparatus. Additionally included is a switch in an electrical circuit to enable selection of attenuation of excessive noise levels or normal amplification. The switch can be controlled either manually by means of a toggle on a housing enclosing the various components, or automatically in response to the sensed noise level.

14 Claims, 2 Drawing Sheets

ACOUSTICS CONDITIONER

TECHNICAL FIELD

The present invention deals broadly with the field of sound conditioning for the purpose of restricting the maximum sound pressure delivered to a hearer without sacrificing intelligibility. More specifically, however, the present invention deals with an acoustic conditioning system that is operational in modes both to effect sound attenuation and to accomplish amplification, as necessary. The focus of the preferred embodiment is a hearing aid which can be selectively switched between operational modes wherein high level sounds can be attenuated in normal, industrial or recreational environments, or amplified, as conditions warrant.

BACKGROUND OF THE INVENTION

Noise protection is necessary in a multiplicity of circumstances. Absent some means for protecting against excessive noises, aggravated hearing problems could occur in a person of relatively unimpaired hearing. Various medical conditions exist, however, wherein a person's hearing is particularly sensitive. One of these conditions is known as hyperacusis. Hyperacusis is a condition wherein a person experiences a collapsed tolerance to normal environmental sounds. It is a hearing disorder wherein the individual becomes highly sensitive to ambient noise. A person who experiences a condition such as hyperacusis loses much of his normal dynamic hearing range. Further, however, common noise conditions can be perceived as being unbearably loud. In aggravated conditions, the situation can be extremely painful.

A further hearing disorder of this nature is recruitment. In the case of hyperacusis, an individual is highly sensitive to sound but frequently experiences little or no hearing loss. A person with recruitment, on the other hand, is also highly sensitive to sound, but also experiences hearing loss. Extreme recruitment is a condition which is often confused with hyperacusis.

Obviously, there are other situations which dictate a need for aural protection. Persons having relatively normal hearing could experience conditions in loud industrial environments that could, over a period of time of exposure thereto, cause hearing impairment. Such loud environments may cause an aggravation of an existing hearing loss if aural protection is not used. In recognition of this fact, the Occupational Safety and Health Administration (OSHA) has imposed noise exposure limits for industrial environments. The standard noise exposure limit imposed is 90 dBA over an eight-hour period.

Another circumstance in which noise attenuation can be necessary is in vocational situations such as airport operations. Again, because of excessive noise, severe hearing impairment can result after exposure to such noise over time. Limitations are, therefore, imposed by governmental agencies in order to protect the hearing of employees working in such an environment.

Day-to-day military operations can also create conditions under which personnel experience extremely high noise levels. Obviously, a common military environment is air operations. Air operations are performed in virtually every branch of the armed services. In some cases, military personnel are exposed to helicopter noise; in other circumstances the excessive noise can be created by fixed-wing military aircraft. In either case, however, the noise level is far above a level to which personnel should normally be exposed.

Also in the military, personnel are exposed to excessive noise levels as a result of weapons firing. The weapons might be missiles, large guns, or small arms. In the case of virtually any weapon, however, high noise levels are generated which can cause damage to the hearing of personnel exposed to such noise.

Even apart from vocational and military environments, people are, on a day-to-day basis, exposed to loud noises, such as, for example, in recreational environments. Certainly, hunting is one environment in which a person is exposed to high decibel levels.

The problems of high noise level environments are aggravated by the fact that, very commonly, high level noise periods are alternated with other periods of time during which ambient noise is at a normal level. One very common solution offered to eliminate, or at least minimize, high noise level dangers is a device such as a common passive aural protector. Such a device typically includes a pair of cup-like structures which are mated together by a band which is fitted over a wearer's head. The cup-like structures normally include some sort of padded material on an inwardly facing oval surface brought to bear against a side of the wearer's head so that a cup-like structure tightly encircles the ear area of the individual. In the military, this type of device is known as "Mickey Mouse Ears", and it is a device which is totally passive in the way it functions. That is, it merely filters the noise in a passive sense.

Obviously other passive noise attenuation devices have been devised and are used in various environments. Another very unsophisticated system is common ear plugs.

Some sophisticated systems have also been created. For example, electronic earmuffs have been devised which serve to electronically filter noise to a tolerable level.

Most of such systems discussed above, however, merely function to attenuate noise. No relief is given, in systems which merely function to attenuate noise, for an environment wherein conditions vary between excessive noise, at one time, and normal ambient conditions, at another.

In the case of a person already having a hearing disability, noise attenuation means are necessary so as not to worsen such a hearing impairment during high noise level periods, but amplification means are necessary during normal ambient noise periods. Options available to individuals having such impairments, utilizing prior art technology, include wearing a normal amplification hearing aid without any type of acoustic protection. Such an option, however, places the individual at further risk to noise-induced hearing loss because hearing aids are not designed to hold down, to a sufficient degree, the maximum sound pressure delivered.

Other options include wearing some sort of passive hearing protection and no hearing aid. In such a circumstance, however, the individual would be limited or possibly even fully unable to communicate. He might, therefore, become disabled from performing work duties.

Electronic earmuffs, as previously discussed, serve to afford hearing protection to the user. They are, however, relatively clumsy as hearing aids for hearing impaired persons requiring amplification. The employment of a hearing aid underneath electronic earmuffs can result in acoustic feedback and resultant inability to pick up desired sounds.

It is to these problems and the dictates of the prior art that the present invention is directed. It is an improved acoustic conditioner which enables these problems to be significantly surmounted.

SUMMARY OF THE INVENTION

The present invention is a device which functions to condition acoustical energy brought to bear upon the ear of a user of the device. The device includes circuitry for implementing a mode of electronically attenuating excessive noise levels in the vicinity of the wearer while still amplifying speech, music and other desired sounds. Such attenuating circuitry includes components by which an output sound pressure level is compressed below a desired level.

In one embodiment of the invention, the device can further include components which effect implementation of a normal hearing aid amplification of ambient sound level mode so that a hearing impaired user of the device can hear in accordance with his needs. Certain embodiments of the invention also include structure to enable selective actuation of either the attenuation or amplification modes. A switch interposed in circuitry within a housing enclosing the various components of the device can be employed for this purpose.

The switch, in turn, can be controlled in a number of fashions. A manual toggle can be mounted on the housing and operationally connected to the switch so that the wearer of the device can volitionally and positively select between amplification and attenuation modes.

Automatic control means are also envisioned. Such automatic controls would function in response to the noise level which is sensed at the device. A resistor in the circuitry is used to implement noise protection. An automatic noise switch is utilized to short out or place the resistor into the circuit in response to the background noise level. Since, in most cases, speech, music and other desired sounds generate a relatively short-term signal and excessive noise generates a long-term stationary signal relative to the signal representative of desired sounds, differentiation of the two signals can be made by averaging the received signal over a long period of time. The present invention employs a rectifier to sense the long-term average signal level. A field effect transistor is employed as an analog switch in order to change the impedance across the resistor which is used to implement the noise protection mode.

The present invention is thus an improved acoustic conditioning device which solves many of the problems of the prior art. More specific features and advantages obtained in view of those features will become apparent with reference to the DETAILED DESCRIPTION OF THE INVENTION, the appended claims, and the accompanying drawing figures.

DETAILED DESCRIPTION OF THE INVENTION

Figure 1:
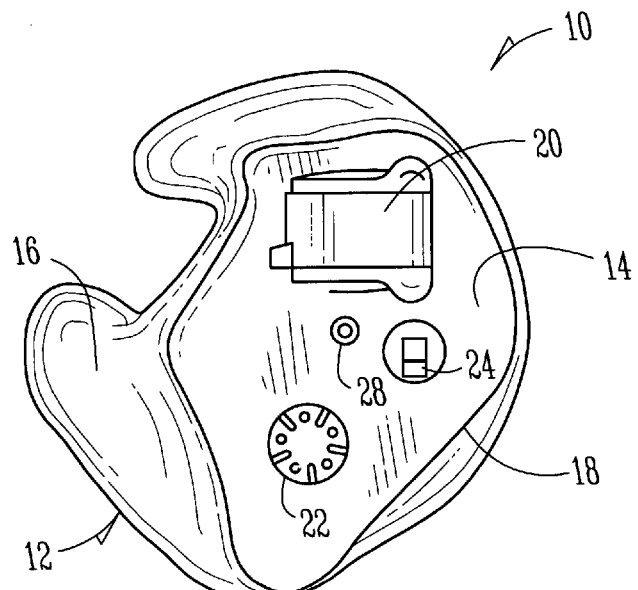
FIG. 1 is an elevational view of an in-the-ear hearing aid in accordance with the present invention.

Referring now to the drawings, wherein like reference numerals denote like elements throughout the several views, FIG. 1 illustrates an in-the-ear hearing aid 10 in accordance with the present invention. The hearing aid 10 includes a housing 12 having a face plate 14 and a molded shell 16. The molded shell portion 16 is shown as being mated to the face plate 14 along a line of intersection 18.

The molded shell portion 16 is typically custom molded to fit the individual person having a hearing impairment intending to use the hearing aid 10. The shell portion 16 typically has a soft ear tip (not shown) for comfort and a better acoustic seal during mandibular movement. Molding is accomplished in accordance with processes known in the prior art. The face plate 14 is electronically in cooperation with a circuit board (not shown) located within the hearing aid housing 12. The circuit board embodies the circuitry for the hearing aid device 10.

The face plate 14 is shown as including a battery door 20 which can be opened to accept initial installation or replacement of a battery (not shown). The face plate 14 also mounts a volume control dial 22, a manual toggle 24, which controls a circuitry switch 26, and a microphone 28. The volume control dial 22 and microphone 28 function as do similar components known in the prior art. The manual toggle 24 and the switch 26 it controls will be discussed hereinafter.

Figure 2:
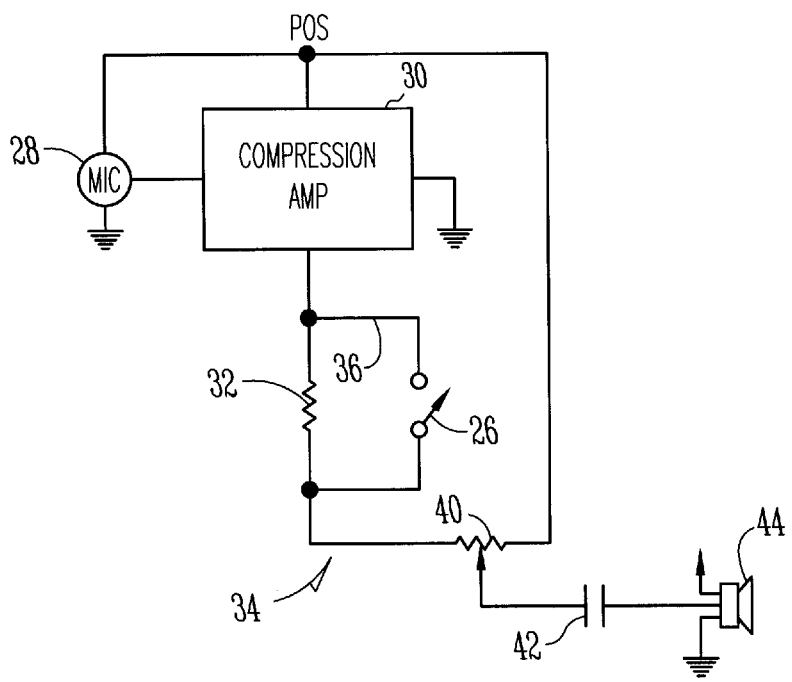
FIG. 2 is a general schematic circuit diagram illustrating the present invention.

FIG. 2 illustrates the basic operation of the invention, regardless of whether switching between attenuation and amplification modes of operation is accomplished manually or automatically. Sound is sensed by the microphone 28, converted into an electrical signal, and conditioned in a manner consistent with the needs of the hearing impaired person for whom the hearing aid 10 is constructed. The compression amp 30 illustrated in FIG. 2 is used in this regard in a manner as known in the prior art.

FIG. 2 also illustrates a resistor 32 which is interposed in the circuit 34. The specific resistance of this component 32 may vary from application to application, but a 1.2 Megohms resistance has been found to be acceptable for functioning to limit noise exposure of a wearer of the hearing aid 10 to 90 dBA over an eight-hour period.

The circuit 34 includes a bypass leg 36 which contains switch 26. A MICROTRONIC No. 531 500MA rated switch has been found acceptable to function for this purpose. The switch 26, when closed, shorts out the noise protection resistor 32 in the circuit 34 and enables normal amplification in accordance with the wearer's specific need. When the switch 26 is open, however, the circuit path is through the noise protection resistor 32 and the signal is significantly reduced. Sound pressure compression results to an extent so that the OSHA maximum requirements are not exceeded.

FIG. 2 also shows a volume control potentiometer 40, controlled by volume control dial 22, a coupling capacitor 42, and a receiver 44. These components function in a manner in accordance with the prior art. Typically, the volume control potentiometer is of a 10 Kohms value.

Operation of the noise protection resistor bypass switch 26 can occur in a number of manners. The switch 26 can be manually operated. Manual operation of the switch 26 entails utilization of the toggle 24 on the face plate 14 of the hearing aid housing 12. In one position of the toggle 24, the switch 26 will be in an open configuration, while, in the other position of the toggle 24, the switch 26 will be closed.

Operation of the switch 26 can also be automatic in response to the level of noise sensed by the hearing aid 10. More detailed discussion of automatic operation will be given with respect to FIGS. 3 and 4 hereinafter.

As previously discussed, there can be a manual toggle 24 for effecting operation of the switch 26 in the bypass leg 36 of the circuit 34. There are, however, a number of disadvantages to employment of a manual toggle 24. First, space is at a premium on the face plate 14 of the hearing aid 10. By implementing automatic operation of the switch 26, the toggle 24 can be eliminated. Further, when a toggle 24 is employed, the wearer of the hearing aid 10 is required to volitionally effect movement of the toggle 24 in order to flip the switch 26. Consequently, automatic switching is a distinct advantage.

Figure 3:
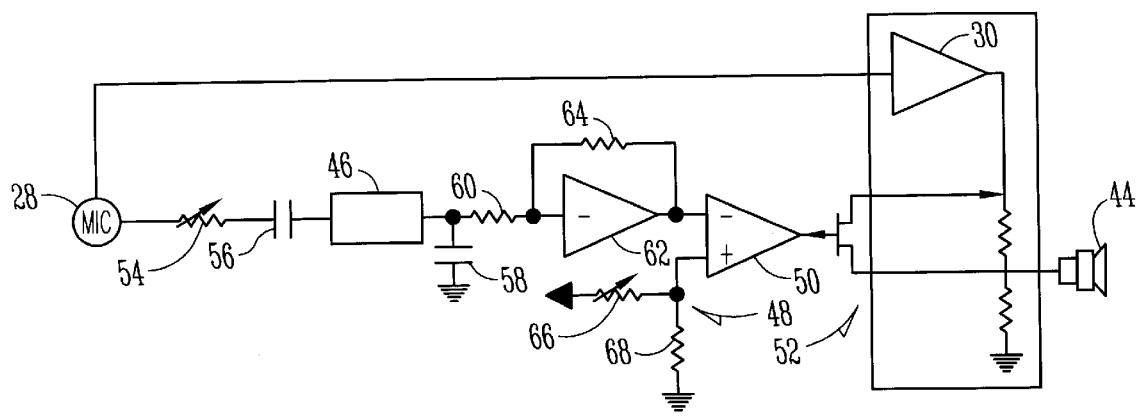
FIG. 3 is a schematic drawing illustrating a first embodiment of an automatic attenuator mode operation.

FIG. 3 shows a first embodiment for implementing automatic switching. It will be borne in mind, when considering the embodiments of both FIGS. 3 and 4, that speech or other desired sounds are typically characterized as a short-term average signal level, and noise is characterized as a long-term stationary signal, relative to speech signals. The average time period of a high-energy speech pulse can be less than several hundred milliseconds; background noise typically has a time period greater than that. Normal speech and other normal sounds, on the one hand, and noise, on the other hand, can thereby be differentiated. This can be accomplished by averaging the received signal over a long period of time.

The microphone 28 picks up ambient sound including both normal speech sound and noise. A preamplifier/rectifier 46 functions to represent the noise level signal and voltage. After being amplified, the measured noise level signal from the preamplifier/rectifier 46 is compared with a preset threshold voltage level inputted from a voltage divider 48. A comparator 50 generates logic voltage signals which control the gate voltage of a P-channel field effect transistor (FET) 52. The FET 52 is connected in parallel with the noise protection resistor 32. When the background conditions are normal and there is not excessive noise, the noise level is lower than a preset threshold. Consequently, the P-channel FET 52 is on and the noise protection resistor 32 is shorted out. When the noise level exceeds the threshold, the FET 52 is turned off and the resistor 32 is placed into the circuit.

The preamplifier circuit, comprising the preamplifier/rectifier 46, is an off-the-shelf component such as the Gennum 581. As will be understood, the preamplifier circuit has two primary functions. These are, first, to amplify the sensed signal from the microphone 28 and, second, to adjust the threshold of the rectifier in the Gennum 581. The values of a resistor 54 and capacitor 56 in the circuit in series with the preamplifier/rectifier 46 should be selected so that the signal from the microphone 28 to the amplification circuit is not significantly reduced. The resistor 54 would, typically, be a variable resistor and, by adjusting this resistor's value, the gain of the preamplifier circuit and the threshold of the rectifier can be varied.

An additional capacitor 58 is connected to the rectifier output of the Gennum 581. The value selected for this second capacitor 58 determines the time constant of the rectifier output signal. Consequently, by adjusting the value of this capacitor 58, the switch response time and release time, responsive to the measured noise signal levels, can be varied.

The voltage across capacitor 58 functions to provide the noise level signal. This signal, in turn, is amplified by an inverting voltage amplifier circuit which includes a resistor 60 in series with an amplifier 62 and another resistor 64 in parallel with the amplifier 62. The voltage divider 48, which includes another variable resistor 66 and an additional non-variable resistor 68, provides the threshold voltage for the voltage comparator 50. The overall sensitivity of the switch 26 is determined by the threshold of the rectifier and the threshold of the comparator. This is accomplished by adjusting the value of the resistor 54 and the threshold of the comparator 50 by adjusting the resistor 66.

Figure 4:
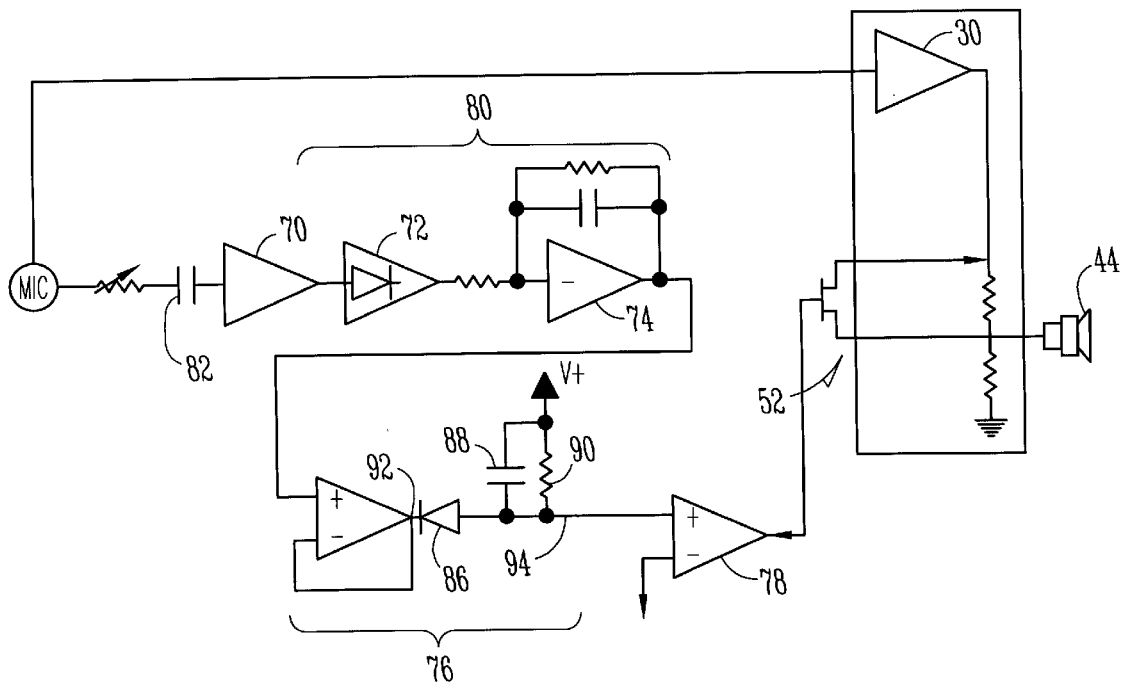
FIG. 4 is a schematic drawing illustrating a second embodiment of an automatic attenuator mode operation.

FIG. 4 illustrates a second embodiment for effecting automatic operation of the switch 26. In this alternative embodiment, noise is detected by obtaining the minima of the envelope of the noise signal. During pauses between speech intervals, the envelope of this speech signal depends upon the noise floor. The higher the noise level, the greater the envelope minima. In view of this fact, the output of the noise detector can be used as a logic signal to control an analog switch.

FIG. 4 illustrates a noise detector which includes a preamplifier 70, a rectifier 72, a low-pass filter 74, envelope minima detector 76, and a voltage comparator 78. The signal sensed by the microphone 28 is fed to the preamplifier 70 to raise the signal to a proper level. The rectifier 72 and low-pass filter 74, together, form an envelope demodulator 80. The envelope minima detector 76 measures the minima of the envelope, and the minima, so measured, are compared with a predetermined threshold voltage in the comparator 78. In environments wherein there is not excess noise, the measured noise level is lower than a reference voltage, the preset threshold voltage, and the output of the comparator 78 is logic low. When the noise level exceeds the preset threshold, the output of the comparator 78 goes high to turn the FET off.

The signal sensed from the microphone 28 is ac coupled through a capacitor 82 to the preamplifier 70. After amplification is accomplished, the signal is fed to the rectifier 72. This rectifier 72 can be a full wave or half wave rectifier, as conditions dictate. The envelope is obtained by filtering the rectified signal through the low-pass filter 74. The cut-off frequency of the low-pass filter 74 should be equal to or less than 30 Hertz. A voltage follower 84, diode 86, capacitor 88, and resistor 90 form the envelope minima detector circuit. The resistor 90 and capacitor 88 in the minima detector circuit are connected to a positive power supply. When the voltage at an intersection 92 is lower than the voltage at 94 minus the diode voltage drop, the voltage at 94 follows the voltage at intersection 92; when the voltage at 92 increases from a minimum value, the diode 86 is reverse biased, and voltage at 94 depends on the time constant which is a product of the resistance of 90 and the capacitance of 88. The minima of the envelope are, thereby, detected in view of these factors. The detected envelope minimum value is then fed to the circuit of comparator 78 to compare with a preset threshold voltage, the reference voltage. The reference voltage represents the threshold of the noise level. The desired value of the voltage reference can be determined through experimentation. It is desirable that this reference voltage be variable.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A device for conditioning acoustical energy in a signal, the device comprising:
   a circuit that selectively attenuates an undesired noise while selectively amplifies a desired sound in the signal, wherein the circuit includes an attenuating circuit that attenuates the undesired noise, wherein the circuit includes an amplification circuit to amplify the desired sound, wherein the circuit includes an actuation that selectively selects at least one of the attenuating circuit and the amplification circuit, wherein the actuation includes a switch that is controllable in at least an automatic mode, wherein the automatic mode is activated in response to a detection of at least one of the desired sound and the undesired noise, wherein the detection includes a comparison between a short-term average component of an input signal to a long-term component of the input signal.

2. The device of claim 1, wherein the switch is also controllable in a manual mode, and wherein the manual mode includes a toggle switch.

3. The device of claim 1, wherein the desired sound is detected when the short-term average component of the input signal is relatively large when compared to the long-term component of the input signal, and the undesired noise is detected when the short-term average of the input signal is relatively small to the long-term component of the input signal.

4. The device of claim 1, wherein the automatic mode includes a rectifier, wherein the rectifier senses the average of the signal.

5. The device of claim 4, wherein the automatic mode includes a noise protection circuit, wherein the noise protection circuit includes a resistor, and an automatic noise switch to selectively switch the resistor in response to a background noise level, wherein the automatic noise switch includes a field effect transistor that changes the impedance across the resistor.

6. A method for conditioning acoustic energy, the method comprising:

transforming a sound received by a microphone into a signal; and conditioning the signal, wherein conditioning includes selectively switching an act of attenuating an undesired noise in the signal while amplifying a desired sound in the signal, wherein the act of selectively switching includes at least an automatic mode, wherein the automatic mode includes a comparison between a short-term average component of the signal to a long-term component of the signal.

7. The method of claim 6, wherein the act of selectively switching also includes a manual mode, and wherein the manual mode includes a noise protection resistor.

8. The method of claim 7, where in selectively switching includes selectively switching through the manual mode, wherein the noise protection resistor acts to limit noise exposure to about 10 to about 90 dBA over a period of time.

9. The method of claim 7, wherein selectively switching includes selectively switching through the manual mode, wherein the noise protection resistor is about 1.2 MegaOhms.

10. The method of claim 7, wherein selectively switching includes selectively switching through the manual mode in a period of time of about eight hours.

11. The method of claim 7, wherein selectively switching includes selectively switching through the manual mode that is activated by a toggle switch.

12. The method of claim 6, wherein the desired sound is detected when the short-term average component of the input signal is relatively large when compared to the long-term component of the input signal, and the undesired noise is detected when the short-term average of the input signal is relatively small to the long-term component of the input signal.

13. The method of claim 12, wherein the desired sound is characterized as the short-term average signal, and wherein the undesired noise is characterized as the long-term stationary signal relative to the desired signal, wherein the act of averaging detects whether the signal is the short-term average signal or the long-term stationary signal, and wherein the automatic mode acts to attenuate the signal if the act of averaging detects that the signal is the long-term stationary signal, and wherein the automatic mode acts to amplify the signal if the act of averaging detects that the signal is the short-term average signal.

14. Acoustical conditioning apparatus, comprising:

(a) means for electronically implementing a mode of operation of said apparatus for attenuating excessive noise levels to a reduced audible level, said attenuating mode means including a circuit for compressing an output sound pressure level below a desired level;

(b) means for implementing a mode of operation of said apparatus for amplifying ambient sound level in accordance with normal needs of a hearing impaired user of said apparatus; and (c) means for volitionally selecting actuation of one of said attenuating mode means and said amplifying mode means through an electrical circuit, wherein said electrical circuit includes a switch and an automatic means for controlling the position of said switch which functions automatically in response to sensed noise level, said automatic means for controlling the position of said switch further comprises:

(i) a resistor, in said electrical circuit, to control said amplification mode means and said attenuation mode means to regulate noise level;

(ii) a rectifier, in said electrical circuit, to sense a generally short-term average level representative of normal acoustical range sounds;

(iii) a field effect transistor, in said electrical circuit, in cooperation with said resistor to change the ompedance across said resistor in response to the short-term average signal level sensed and a longer signal, representative of background noise, sensed.

* * * * *

UNITED STATES PATENT AND TRADEMARK OFFICE
CERTIFICATE OF CORRECTION

PATENT NO.   : 6,359,992 B1
DATED        : March 19, 2002
INVENTOR(S)  : David A. Preves, Robert L. Miller, Lawrence T. Hagen and Ning Shen It is certified that error appears in the above-identified patent and that said Letters Patent is hereby corrected as shown below:

Column 8,
Line 45, insert -- and -- after "sounds;", therefor.
Lines 46-47, delete "ompedance" and insert -- impedance --, therefor.

Signed and Sealed this

Twenty-fourth Day of September, 2002

Attest:

Attesting Officer

JAMES E. ROGAN
Director of the United States Patent and Trademark Office